US008092982B2

(12) United States Patent
Lee et al.

(10) Patent No.: US 8,092,982 B2
(45) Date of Patent: Jan. 10, 2012

(54) PHOTOSENSITIVE PASTE COMPOSITION, BARRIER RIB PREPARED USING THE COMPOSITION AND PLASMA DISPLAY PANEL COMPRISING THE BARRIER RIB

(75) Inventors: Beom-Wook Lee, Suwon-si (KR);
Jong-Seo Choi, Suwon-si (KR);
Kwi-Seok Choi, Suwon-si (KR);
Dong-Hyun Kang, Suwon-si (KR);
Seung-Han Lee, Suwon-si (KR);
Myung-Duk Lim, Suwon-si (KR);
Hoon-Bae Lee, Suwon-si (KR);
Bum-Jin Chang, Suwon-si (KR);
Min-Jae Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 917 days.

(21) Appl. No.: 12/055,215

(22) Filed: Mar. 25, 2008

(65) Prior Publication Data

US 2008/0238318 A1    Oct. 2, 2008

(30) Foreign Application Priority Data

Mar. 26, 2007 (KR) ........................ 10-2007-0029378

(51) Int. Cl.
*H01J 17/49* (2006.01)
*G03F 7/004* (2006.01)
(52) U.S. Cl. ............... 430/287.1; 430/270.1; 430/281.1; 430/198; 313/582
(58) Field of Classification Search ........................ None
See application file for complete search history.

(56) References Cited

U.S. PATENT DOCUMENTS

| | | | |
|---|---|---|---|
| 5,209,688 | A | 5/1993 | Nishigaki et al. |
| 6,117,614 | A | 9/2000 | Takahashi et al. |
| 6,197,480 | B1 | 3/2001 | Iguchi et al. |
| 6,342,322 | B1 | 1/2002 | Kakinuma et al. |
| 6,507,148 | B1 | 1/2003 | Iguchi et al. |
| 6,576,391 | B1 | 6/2003 | Iguchi et al. |
| 2005/0037278 | A1 | 2/2005 | Koishikawa et al. |
| 2005/0271979 | A1 | 12/2005 | Lee et al. |

(Continued)

FOREIGN PATENT DOCUMENTS

JP    04-163552    6/1992

(Continued)

OTHER PUBLICATIONS

Computer-generated translation of JP 2004-318116 (Nov. 2004).*

(Continued)

*Primary Examiner* — John A. McPherson
(74) *Attorney, Agent, or Firm* — Christie, Parker & Hale, LLP

(57) ABSTRACT

Photosensitive paste compositions, barrier ribs of plasma display panels (PDPs) prepared using the same, and PDPs including the barrier ribs are provided. The photosensitive paste composition includes an organic-inorganic complex sol and an inorganic material, wherein the average refractive index ($N_1$) of the organic-inorganic complex sol and the average refractive index ($N_2$) of the inorganic material satisfy the equation $-0.2 \leq N_1 - N_2 \leq 0.2$. Using the photosensitive paste composition, patterned barrier ribs for PDPs having high resolution and high precision can be made by exposure to light only once. Barrier ribs having higher reflective indices than conventional barrier ribs can also be obtained.

24 Claims, 1 Drawing Sheet

U.S. PATENT DOCUMENTS

| | | | |
|---|---|---|---|
| 2007/0048462 A1 | 3/2007 | Takebe et al. | |
| 2007/0287094 A1 | 12/2007 | Mori | |
| 2008/0026320 A1* | 1/2008 | Lee et al. | 430/270.1 |
| 2008/0290314 A1* | 11/2008 | Lee et al. | 252/62.3 V |

FOREIGN PATENT DOCUMENTS

| | | |
|---|---|---|
| JP | 1998-007432 | 1/1998 |
| JP | 1998-062981 | 3/1998 |
| JP | 11-073874 | 3/1999 |
| JP | 11-102645 | 4/1999 |
| JP | 11-139846 | 5/1999 |
| JP | 1999-338129 | 12/1999 |
| JP | 1999-352699 | 12/1999 |
| JP | 2000-191945 | 7/2000 |
| JP | 2000-290040 | 10/2000 |
| JP | 2000-294147 | 10/2000 |
| JP | 2002-122985 | 4/2002 |
| JP | 2002-214772 | 7/2002 |
| JP | 2002-358900 | 12/2002 |
| JP | 2004-307853 | 11/2004 |
| JP | 2004-318116 | 11/2004 |
| JP | 2005-247592 | 9/2005 |
| JP | 2007-086772 | 4/2007 |
| JP | 2007-294427 | 11/2007 |
| JP | 2008-003599 | 1/2008 |
| KR | 10-2002-0012626 | 2/2002 |
| KR | 10-0412293 B1 | 4/2004 |
| KR | 10-2006-0100270 | 9/2006 |

OTHER PUBLICATIONS

Patent Abstracts of Japan, Publication 11-102645, Published Apr. 13, 1999, for Horiuchi, et al.

Patent Abstracts of Japan, Publication 2000-290040, Published Oct. 17, 2000, for Masaki, et al.

Patent Abstracts of Japan, Publication 2002-122985, Published Apr. 26, 2002, for Masaki, et al.

Patent Abstracts of Japan, Publication 2004-318116, Published Nov. 11, 2004, for Shigeta, et al.

Patent Abstracts of Japan, Publication No. 2004-318116; Date of Publication: Nov. 11, 2004; in the name of Kazuki Shigeta, et al.

Korean Office Action, with English translation, dated Feb. 27, 2008, for corresponding Korean Patent Application No. 10-2007-0029378, indicating the relevance of JP 2004-318116.

English machine translation of Japanese Publication 1998-007432, listed above, 31 pages.

English machine translation of Japanese Publication 1998-062981, listed above, 19 pages.

English machine translation of Japanese Publication 1999-338129, listed above, 46 pages.

English machine translation of Japanese Publication 1999-352699, listed above, 44 pages.

English machine translation of Japanese Publication 2000-191945, listed above, 29 pages.

English machine translation of Japanese Publication 2002-358900, listed above, 29 pages.

English machine translation of Japanese Publication 2007-086772, listed above, 58 pages.

U.S. Office action dated Sep. 17, 2008, for U.S. Appl. No. 11/764,991, 16 pages.

U.S. Office action dated Mar. 5, 2009, for U.S. Appl. No. 11/764,991, 13 pages.

U.S. Office action dated Oct. 20, 2009, for U.S. Appl. No. 11/764,991, 11 pages.

* cited by examiner

PHOTOSENSITIVE PASTE COMPOSITION, BARRIER RIB PREPARED USING THE COMPOSITION AND PLASMA DISPLAY PANEL COMPRISING THE BARRIER RIB

CROSS-REFERENCE TO RELATED PATENT APPLICATION

This application claims priority to and the benefit of Korean Patent Application No. 10-2007-0029378, filed on Mar. 26, 2007 in the Korean Intellectual Property Office, the entire content of which is incorporated herein by reference.

BACKGROUND OF THE INVENTION

1. Field of the Invention

The present invention relates to photosensitive paste compositions, to barrier ribs of plasma display panels (PDPs) prepared using the same, and to PDPs including the barrier ribs.

2. Description of the Related Art

In PDPs, barrier ribs are structures formed on the rear panel (or rear substrate) which define discharge spaces and prevent electrical or optical crosstalk between adjacent discharge cells. The barrier ribs may have various shapes (such as stripes or matrices) and sizes (such as width and pitch) depending on the type of PDP.

The barrier ribs are formed on the dielectric layer, which covers the address electrodes on the lower substrate of the PDP. The barrier ribs are formed by screen printing, sand blasting, etching, photolithography, or the like.

When the barrier ribs are formed by screen printing, a barrier rib paste is printed on a substrate using a patterned mask and a squeegee, and the paste is dried to remove solvent. The printing and drying steps are repeated several times to obtain a film with the desired thickness. The obtained film is sintered to form the barrier rib. However, this method is time-consuming, and presents difficulties in forming uniformly patterned barrier ribs due to misalignments caused by low resolution and repeated printing.

When the barrier ribs are formed by sand blasting, a barrier rib paste is printed once on a substrate by a table coater and then dried to obtain a film with the desired thickness. A dry film resist with sanding resistance is then laminated on the film and patterned through exposure to light and development. Then, micro-abrasive sandblasting is performed under high pressure using the dry film resist pattern as a mask to obtain a patterned film. The residual dry film resist is removed and the patterned film is sintered to complete the barrier ribs. Although barrier ribs formed by sandblasting have higher resolution than those formed by screen printing, sandblasting is a complicated process and can damage electrode terminals due to collision of the terminals with abrasive sand.

Etching is similar to sandblasting. Etching, unlike sandblasting, forms barrier ribs by patterning a sintered membrane using an etching solution. Etching can produce high resolution, but manufacturing costs are high.

Photolithography forms barrier ribs by printing and drying a photosensitive paste to form a film with the desired thickness. The film is exposed to UV light by a UV exposure system equipped with a photomask. The printing, drying, and exposure steps are repeated at least twice. The film is then developed to selectively remove unexposed regions, followed by sintering to obtain the barrier ribs. Photolithography can form barrier ribs with higher resolution than screen printing, and does not require a dry film resist or sanding process as required for sandblasting. However, photolithography requires many processes and misalignment can occur due to the repeated processes.

Therefore, methods have been developed for forming barrier ribs by exposure to light only once by minimizing the difference between the light refractive indices of inorganic and organic materials. This minimizes scattering and reflection of light irradiated at the interface between the inorganic and organic materials during exposure. Such methods are widely used.

However, these methods have several problems. First, to minimize the difference between refractive indices of the inorganic and organic materials, inorganic or organic materials having a refractive index in a specific range (which is not generally used) has to be used. The inorganic materials of the barrier rib materials that are generally used in sand blasting, etching, or the like generally have a refractive index ranging from 1.60-1.80, and the organic materials generally have a refractive index ranging from 1.50-1.60 or less. Thus, the difference between the refractive indices of these inorganic and organic materials can not be minimized. Since the inorganic materials have a high refractive index, a material having a lower refractive index has to be developed and used to minimize the difference between the refractive indices of the inorganic and organic material. On the other hand, an organic material having a higher refractive index has to be developed and used.

Second, to use a material having a high refractive index as the organic material, a binder containing Br atoms (which are harmful to the human body) has to be used. Also, an expensive monomer containing S has to be used.

Third, in sand blasting, etching or the like, a sintered powder of titania, alumina, silica, zirconia oxide, yttria, magnesia, zinc oxide, manganese oxide, iron oxide, tin oxide, copper oxide, lead oxide, or the like is used to maintain the shape of the barrier ribs, increase the reflective index of the barrier ribs, or color the barrier ribs. However, in methods requiring minimization of the difference between refractive indices of organic and inorganic materials, these powders cannot be used because the powders have very high refractive indices, and thus the difference between refractive indices of the organic material and the powder cannot be minimized. This causes the powders to interfere with the transmittance of ultraviolet rays irradiated during exposure to light so that barrier ribs can not be formed by one exposure to light.

Due to these problems, glass having a high melting point and a low refractive index and that is transparent to ultraviolet rays is used instead of the powder. As a result, the prepared barrier ribs have a low reflective index, and thus reducing the reflective index of visible rays emitted when the PDP operates, leading to reduced luminance compared with barrier ribs prepared by sand blasting or etching. To compensate for the reduced luminance, the barrier ribs are produced with narrower widths than the widths of barrier ribs prepared using other methods. This maximizes the coated phosphor area.

Lastly, barrier ribs prepared by minimizing the difference between the refractive indices of the organic and inorganic materials have higher surface roughnesses than the barrier ribs prepared using other methods. This is because when the barrier ribs are formed one exposure to light, the ultraviolet rays irradiated during the exposure to light have to reach the bottom surface. To do so, the difference between refractive indices of the inorganic and organic materials must be minimized, but also, an inorganic material having a larger particle diameter than that used in other methods (particularly etching) has to be used. In addition, the surface of the portion exposed to light for curing is removed bit by bit by developing with a developing solution, and thus the surface becomes rough. The surface with roughness tends to maintain its shape after sintering, however the shape depends on the extent of sintering. Thus, the finally prepared barrier rib cannot have a higher surface roughness than barrier ribs prepared using other methods. When the membrane of the barrier rib becomes rough, reflection efficiency with respect to visible rays is reduced, and thus crosstalk between discharge cells can be induced besides, reductions in luminance occur, the breaking strength of the panel is reduced, and noises caused by shaking of the upper and lower substrate can occur.

To increase the reflective index of the barrier ribs, titanium dioxide, alumina, zirconium oxide or silica powder has been added to the inorganic material. However, as described above, these components have high refractive indices, and although small amounts of the components are added, light exposure sensitivity is significantly reduced. Accordingly, use of the components is limited.

In addition, 5-80 nm sized particles of titanium dioxide, alumina, silica, zirconium oxide, yttria, or the like has been used. Alternatively, the reflective index of the barrier ribs has been increased by adding 5-80 nm sized particles of titanium dioxide, alumina, silica, zirconium oxide, yttria, magnesia, zinc oxide, manganese oxide, iron oxide, tin oxide, copper oxide or lead oxide. This imparts some improvement, since the particles having very small diameters compared to the wavelength of light irradiated during exposure do not cause scattering, reflection or the like with respect to light, and cause an increase in the refractive index of the organic material. Accordingly, there is no need to use an inorganic material having a low refractive index and an organic material having a high refractive index. However, when the barrier ribs are prepared by simply adding the 5-80 nm sized particles by mixing, 3-roll milling or the like, the particles are not dispersed in the paste in a single particle state and are instead agglomerated with one another.

In addition, a method of increasing the luminance of the barrier ribs by adding a metal sol prepared in the presence of polyhydric alcohol has been proposed. However, the paste is prepared by minimizing only the difference between refractive indices of the inorganic and organic material, not taking into consideration the refractive index and specific gravity of the metal sol. Therefore, an inorganic material having a low refractive index and an organic material having a high refractive index have to be used.

SUMMARY OF THE INVENTION

In one embodiment of the present invention, a photosensitive paste composition is provided for making a pattern of a barrier rib for a PDP. The photosensitive paste composition has high resolution and high precision, and is exposed to light only once. The photosensitive paste composition is used to make a barrier rib having a higher reflective index than a conventional barrier rib.

According to another embodiment of the present invention, a barrier rib of a PDP is prepared using the photosensitive paste composition. In yet another embodiment, a PDP includes the barrier rib.

According to an embodiment of the present invention, a photosensitive paste composition includes an organic-inorganic complex sol and an inorganic material, wherein the average refractive index ($N_1$) of the organic-inorganic complex sol and the average refractive index ($N_2$) of the inorganic material satisfy Equation 1 below.

$$-0.2 \leq N_1 - N_2 \leq 0.2 \quad \text{Equation 1}$$

BRIEF DESCRIPTION OF THE DRAWINGS

The above and other features and advantages of the present invention will become more apparent by reference to the following detailed description when considered in conjunction with the attached drawing in which.

DETAILED DESCRIPTION OF THE INVENTION

Figure 1:
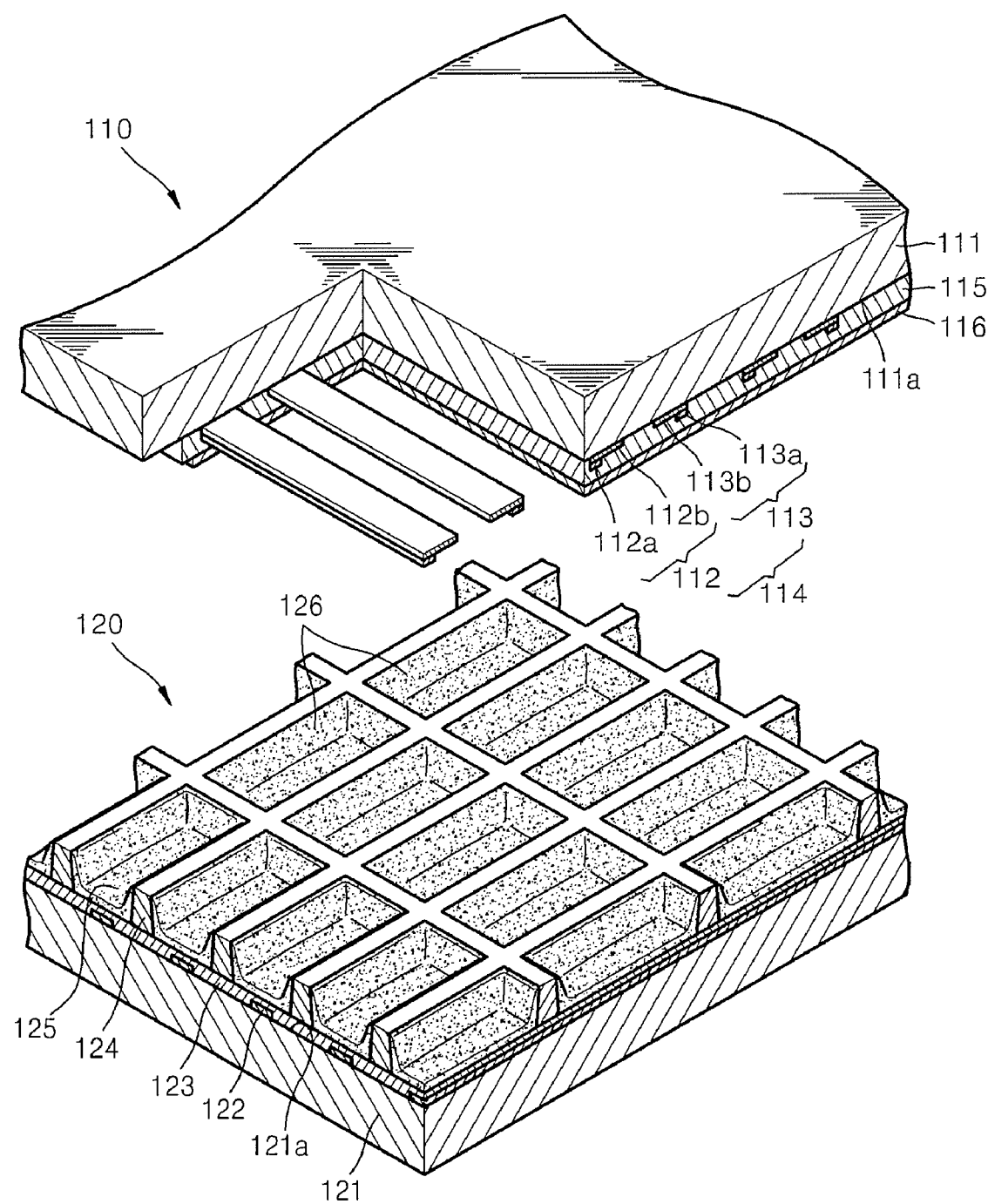
FIG. 1 is a partially exploded perspective view of a PDP according to an embodiment of the present invention.

In one embodiment of the present invention, a photosensitive paste composition includes an organic-inorganic complex sol and an inorganic material, wherein the average refractive index ($N_1$) of the organic-inorganic complex sol and the average refractive index ($N_2$) of the inorganic material satisfy Equation 1 below.

$$-0.2 \leq N_1 - N_2 \leq 0.2 \quad \text{Equation 1}$$

Unlike conventional photosensitive paste compositions, the photosensitive paste composition according to the present embodiment includes an organic-inorganic complex sol. The organic-inorganic complex sol is a sol-state material in which an organic-inorganic complex having an average diameter of several to tens of nanometers is dispersed in an organic material. The organic-inorganic complex is dispersed in the organic material in a stable state in which agglomeration and precipitation do not occur. The organic-inorganic complexes can be used in combination with an inorganic material. A barrier rib prepared using this photosensitive paste composition (including an organic-inorganic complex) has higher reflexibility, increased luminance and compactness and reduced surface roughness compared to conventional photosensitive barrier ribs. In addition, the inventive barrier ribs function as supports, preventing deformation of the shape during sintering.

The organic-inorganic complex sol is generally prepared by performing hydrolysis and condensation reactions using a metal alkoxide or metal halide to prepare a metal oxide having an average particle diameter of several to tens of nanometers. The surface of the prepared metal oxide is coated with a surface modifier to improve dispersibility of the metal oxide in an organic material to prepare an organic-inorganic complex. The prepared organic-inorganic complex is dispersed in an organic material to finally prepare the organic-inorganic complex sol.

Nonlimiting examples of suitable metals for the metal oxide include Si, Ti, Al, Zr, Ta, Ge, Y, Zn, and the like, and combinations thereof. Nonlimiting examples of suitable surface modifiers include single compounds (such as tetraethylorthosilicate (TEOS), 3-methacryloyloxypropyltrimethoxysilane (MPTS), 3-glycidyloxypropyltrimethoxysilane (GPTS), diphenyldimethoxysilane (DPDMS), diphenylsilanediol (DPSD) and the like), and compounds in which the single compound is introduced into a polymer (e.g., compounds in which triethoxysilane is introduced into poly(arylene ether ketone) (PEK) or poly(arylene ether sulfone) (PSF), such as triethoxysilane-capped PEK or triethoxysilane-capped PSF).

The organic-inorganic complex in the organic-inorganic complex sol may have an average particle diameter ranging from about 1 to about 60 nm. In one embodiment, for example, the organic-inorganic complex may have an average particle diameter ranging from about 2 to about 40 nm, or from about 4 to about 20 nm. When the average particle diameter of the organic-inorganic complex is less than about 1 nm, preparation of the complex becomes difficult and it becomes difficult to uniformly disperse the organic-inorganic complex in the organic material. When the average particle diameter of the organic-inorganic complex is greater than about 60 nm, the organic-inorganic complex scatters light when exposed to light, and thus interferes with light transmittance.

The average refractive index of the organic-inorganic complex may range from about 1.3 to about 3.0. The average refractive index of the organic-inorganic complex sol prepared by dispersing the organic-inorganic complex in the organic material may range from about 1.4 to about 2.0. When the average refractive indices of the organic-inorganic complex and the organic-inorganic complex sol are outside these ranges, it becomes difficult to prepare the photosensitive paste composition with a refractive index within the refractive index range given in Equation 1 above.

The average refractive index of the organic-inorganic complex sol is a measured in the absence of solvent. The refractive index of the organic-inorganic complex sol is measured using a refractive index measuring apparatus and by coating the organic-inorganic complex sol on a transparent film or glass substrate and then drying the coated organic-inorganic complex sol for several to tens of minutes at a temperature ranging from about 80 to about 100° C.

In addition, in preparing the organic-inorganic complex sol by dispersing the organic-inorganic complex in the organic material, the organic-inorganic complex is present in an amount ranging from about 5 to about 50 parts by volume with respect to 100 parts by volume of the organic material. When the organic-inorganic complex is present in an amount less than 5 parts by volume with respect to 100 parts by volume of the organic material, the reflective index of the barrier rib is not greatly increased. When the organic-inorganic complex is present in an amount greater than about 50 parts by volume with respect to 100 parts by volume of the organic material, the crosslinking reaction is insufficiently performed when the organic-inorganic complex sol is exposed to light, and thus the barrier rib does not have the desired shape.

When the organic-inorganic complex sol is mixed with an inorganic material, two mixing ratios are taken into consideration. One is the mixing ratio of the refractive index of the organic-inorganic complex sol and the inorganic material. In particular, the values of the refractive indices of the organic-inorganic complex sol and the inorganic material satisfy Equation 1 above. In another embodiment, the values of the refractive indices of the organic-inorganic complex sol and the inorganic material satisfy Equation 2 below, and in another embodiment, the values satisfy Equation 3 below.

$$-0.1 \leq N_1 - N_2 \leq 0.1 \quad \text{Equation 2}$$

$$-0.05 \leq N_1 - N_2 \leq 0.05 \quad \text{Equation 3}$$

In Formulae 2 and 3, each of $N_1$ and $N_2$ is the as defined with respect to Equation 1.

When the relationship between the refractive indices of the organic-inorganic complex sol and the inorganic material is outside the range given in Equation 1, transmittance of light irradiated during exposure to light is reduced so that the barrier rib is not be formed by one exposure to light. When the relation between the refractive indices of the organic-inorganic complex sol and the inorganic material is within the range of Equation 3 above, light exposure sensitivity is excellent, and scattering of irradiated light is reduced so that the barrier rib pattern is substantially straight.

The second mixing ratio to take into consideration is the amount of the metal oxide in the organic-inorganic complex sol with respect to the inorganic material in the photosensitive paste composition. The metal oxide may be present in an amount ranging from about 3 to about 30 parts by volume with respect to 100 parts by volume of the inorganic material. In one embodiment, for example, the metal oxide may be present in an amount ranging from about 5 to about 20 parts by volume with respect to 100 parts by volume of the inorganic material. When the metal oxide is present in an amount less than about 3 parts by volume with respect to 100 parts by volume of the inorganic material, the reflective index of the barrier rib is not greatly increased. When the metal oxide is present in an amount greater than about 30 parts by volume with respect to 100 parts by volume of the inorganic material, the inorganic material is not fully sintered, and thus compactness of the barrier rib is reduced.

The average thermal expansion coefficient ("TEC"), $\alpha$, of the metal oxide and the inorganic material may satisfy Equation 4 below.

$$\text{Substrate TEC} \times 0.9 \leq \alpha \leq \text{Substrate TEC} \quad \text{Equation 4}$$

When the average TEC of the metal oxide and the inorganic material is outside the range of Equation 4, the substrate may bend or break after sintering.

The inorganic material of the photosensitive paste composition may have an average refractive index ranging from about 1.5 to about 1.8. When the average refractive index of the inorganic material is outside this range, the difference between the refractive index of the inorganic material and the refractive index of the organic-inorganic complex sol is so large that a barrier rib is not formed by one exposure to light.

The inorganic material includes a low melting point glass frit and a high melting point glass frit. The low melting point glass frit of the inorganic material is sintered during sintering, thereby forming a compact barrier rib membrane. The high melting point glass frit maintains the shape of the barrier rib membrane during sintering.

The particle shape of the low melting point glass frit is not particularly limited, but may be almost spherical. The nearer the particle shape of the low melting point glass frit is to spherical, the more improved the characteristics with respect to packing ratio and ultraviolet ray transmittance. The average particle diameter of the low melting point glass frit may have a median value $D_{50}$ ranging from about 2 to about 5 µm, a minimum value $D_{min}$ of about 0.1 µm and a maximum value $D_{max}$ of about 20 µm. When the median value $D_{50}$ is less than about 2 µm, or the minimum value $D_{min}$ is less than about 0.1 µm, dispersibility of the low melting point glass frit is reduced so that printing properties deteriorate. In addition, the contraction ratio becomes high during sintering so that a barrier rib having the desired shape is not obtained. When the median value $D_{50}$ is greater than about 5 µm, or the maximum value $D_{max}$ is greater than about 20 µm, the compactness and straightness of the barrier rib are reduced.

A softening temperature (Ts) of the low melting point glass frit may satisfy Equation 5 below.

$$\text{Sintering temperature} - 80° \text{C.} < T_s < \text{sintering temperature} \quad \text{Equation 5}$$

When the softening temperature of the low melting point glass frit is less than or equal to the sintering temperature−80° C., the shape of the barrier rib is deformed during sintering. When the softening temperature of the low melting point glass frit is greater than or equal to the sintering temperature, sintering is not fully performed.

The low melting point glass frit may be present in an amount ranging from about 70 to about 100 parts by volume with respect to 100 parts by volume of the inorganic material. When the low melting point glass frit is present in an amount less than about 70 parts by volume with respect to 100 parts by volume of the inorganic material, sintering is not fully performed.

In one embodiment, the low melting point glass frit includes a complex oxide having at least three oxides selected from oxides of Pb, Bi, Si, B, Al, Ba, Zn, Mg, Ca, P, V, Mo, Te, and the like. The low melting point glass frit can be used alone or in combination with other complex oxides. In another embodiment, the low melting point glass frit may comprise a compound selected from PbO—$B_2O_3$ based glasses, PbO—$SiO_2$—$B_2O_3$ based glasses, $Bi_2O_3$—$B_2O_3$ based glasses, $Bi_2O_3$—$SiO_2$—$B_2O_3$ based glasses, $SiO_2$—$B_2O_3$—$Al_2O_3$ based glasses, $SiO_2$—$B_2O_3$—BaO based glasses, $SiO_2$—$B_2O_3$—CaO based glasses, ZnO—$B_2O_3$—$Al_2O_3$ based glasses, ZnO—$SiO_2$—$B_2O_3$ based glasses, $P_2O_5$ based glasses, SnO—$P_2O_5$ based glasses, $V_2O_5$—$P_2O_5$ based glasses, $V_2O_5$—$Mo_2O_3$ based glasses, and $V_2O_5$—$P_2O_5$—$TeO_2$ based glasses. As used herein, "$P_2O_5$ based glasses" and similar terms refer to glasses having at least the named component (e.g. $P_2O_5$), but that can include other components (e.g. oxides). For example, a $P_2O_5$ based glass may include $P_2O_5$ in addition to other oxides.

The particle shape of the high melting point glass frit is not particularly limited, but may be almost spherical. The nearer the particle shape of the high melting point glass frit is to being spherical, the more improved the characteristics with respect to packing ratio and ultraviolet ray transmittance. The average particle diameter of the high melting point glass frit may have a median value $D_{50}$ ranging from about 1 to about 4 μm, a minimum value $D_{min}$ of about 0.1 μm and a maximum value $D_{max}$ of about 20 μm. When the median value $D_{50}$ is less than about 1 μm, or the minimum value $D_{min}$ is less than about 0.1 μm, light exposure sensitivity is reduced and the contraction ratio is high during sintering so that a barrier rib having the desired shape is not be obtained. When the median value $D_{50}$ is greater than about 5 μm, or the maximum value $D_{max}$ is greater than about 20 um, the compactness and straightness of the barrier rib are reduced.

A softening temperature (Ts) of the high melting point glass frit may satisfy Equation 6 below.

$$T_s > \text{sintering temperature} + 20° C. \qquad \text{Equation 6}$$

When the softening temperature of the high melting point glass frit is less than or equal to the sintering temperature+20° C., the shape of the barrier rib is deformed during sintering.

The high melting point glass frit may be present in an amount ranging from about 0 to about 30 parts by volume with respect to 100 parts by volume of the inorganic material. When the high melting point glass frit is present in an amount greater than about 30 parts by volume with respect to 100 parts by volume of the inorganic material, sintering is not fully performed.

Nonlimiting examples of suitable high melting point glass frits include complex oxides including at least three oxides selected from oxides of Si, B, Al, Ba, Zn, Mg, Ca, and the like. The high melting point glass frit can be used alone or in combination with other complex oxides. In one embodiment, for example, the high melting point glass frit may include a compound selected from $SiO_2$—$B_2O_3$—BaO based glasses, $SiO_2$—$B_2O_3$—CaO based glasses, $SiO_2$—$B_2O_3$—MgO based glasses, $SiO_2$—$B_2O_3$—CaO—BaO based glasses, $SiO_2$—$B_2O_3$—CaO—MgO based glasses, $SiO_2$—$Al_2O_3$—BaO based glasses, $SiO_2$—$Al_2O_3$—CaO based glasses, $SiO_2$—$Al_2O_3$—MgO based glasses, $SiO_2$—$Al_2O_3$—BaO—CaO based glasses, $SiO_2$—$Al_2O_3$—CaO—MgO based glasses, and the like.

The average refractive indices of the low melting point glass frit and the high melting point glass frit may range from about 1.5 to about 1.8, as described above. In addition, the difference between the refractive index $N_3$ of the low melting point glass frit and the refractive index $N_4$ of the high melting point glass frit satisfies Equation 7 below. In one embodiment, the difference satisfies Equation 8, and in another embodiment, the difference satisfies Equation 9.

$$-0.2 \leq N_3 - N_4 \leq 0.2 \qquad \text{Equation 7}$$

$$-0.1 \leq N_3 - N_4 \leq 0.1 \qquad \text{Equation 8}$$

$$-0.05 \leq N_3 - N_4 \leq 0.05 \qquad \text{Equation 9}$$

When the difference between the refractive indices of the low melting point glass frit and the high melting point glass frit is outside the range of Equation 7, transmittance of light irradiated during exposure to light is reduced so that the barrier rib is not formed by one exposure to light.

The organic material includes a binder, a photo initiator and a cross linking agent. In addition, the organic material can include a solvent and/or additives for improving the characteristics of the paste, adjusting viscosity, or the like.

The binder may include an acryl-based resin having a carboxyl group, which enables easy development in an alkali developing solution and easy adjustments to characteristics by changing the composition of components. The acryl-based resin having a carboxyl group enables development in an aqueous alkali solution, making it easier for inorganic components to be dispersed in the photosensitive paste composition, and provides appropriate viscosity and elasticity. The acryl-based resin having a carboxyl group can be prepared by copolymerization of a monomer having a carboxyl group and a monomer having an ethylenically unsaturated group.

Nonlimiting examples of suitable monomers having carboxyl groups include acrylic acids, methacrylic acids, fumaric acids, maleic acids, vinylacetic acids, anhydrides thereof, and combinations thereof. Nonlimiting examples of suitable monomers having ethylenically unsaturated groups include methyl (meth)acrylates, ethyl (meth)acrylates, n-propyl (meth)acrylates, isopropyl (meth)acrylates, n-butyl (meth)acrylates, sec-butyl (meth)acrylates, isobutyl (meth) acrylates, tert-butyl (meth)acrylates, n-pentyl (meth)acrylates, allyl (meth)acrylates, phenyl (meth)acrylates, benzyl (meth)acrylates, butoxyethyl (meth)acrylates, butoxytriethyleneglycol (meth)acrylates, cyclohexyl (meth)acrylates, dicyclopentanyl (meth)acrylates, dicyclopentenyl (meth) acrylates, 2-ethylhexyl (meth)acrylates, glycerol (meth)acrylates, glycidyl (meth)acrylates, isobornyl (meth)acrylates, isodexyl (meth)acrylates, isooctyl (meth)acrylates, lauryl (meth)acrylates, 2-methoxyethyl (meth)acrylates, methoxyethyleneglycol (meth)acrylates, methoxydiethyleneglycol (meth)acrylates, phenoxyethyl (meth)acrylates, stearyl (meth)acrylates, 1-naphthyl (meth)acrylates, 2-naphthyl (meth)acrylates, 2-hydroxyethyl (meth)acrylates, 2-hydroxypropyl (meth)acrylates, aminoethyl (meth)acrylates, styrenes, α-methastyrenes, α-2-dimethylstyrenes, 3-methylstyrenes, 4-methylstyrenes, and combinations thereof.

In addition, the binder has a cross-linkable group formed by reacting the carboxylic group of the copolymer with an ethylenically unsaturated compound. The ethylenically unsaturated compound may be selected from acryloylchloride, methacryloylchloride, allylchloride, glycidylacrylate, glycidylmethacrylate, 3,4-epoxycyclohexylmethylacrylate, and 3,4-epoxycyclohexylmethylmethacrylate.

Alternatively, the copolymer can be used alone as the binder. However, to enhance the film leveling property or thixotropic property, the copolymer is mixed with at least one material selected from cellulose, methylcellulose, ethylcellulose, n-propylcellulose, hydroxyethylcellulose, 2-hydroxyethylcellulose, methyl-2-hydroxyethylcellulose, hydroxypropylcellulose, hydroxypropylmethylcellulose, hydroxybutylmethylcellulose, hydroxypropylmethylcellulose phthalate, cellulose nitrate, cellulose acetate, cellulose triacetate, cellulose acetate butyrate, cellulose acetate hydrogenphthalate, cellulose acetate propionate, cellulose propionate, (acrylamidomethyl)cellulose acetate propionate, (acrylamidomethyl)cellulose acetate butyrate, cyanoethylated cellulose, pectic acid, chitosan, chitin, carboxymethylcellulose, carboxymethylcellulose sodium salt, carboxyethylcellulose, and carboxyethylmethylcellulose.

The copolymer may have a weight average molecular weight ranging from about 500 to about 100,000 g/mol and an acid value ranging from about 50 to about 300 mg KOH/g. If the weight average molecular weight of the copolymer is less than about 500 g/mol, the dispersibility of the inorganic material in the paste is reduced. If the weight average molecular weight of the copolymer is greater than about 100,000 g/mol, the developing speed is too slow or developing is not adequately performed. In addition, if the acid value of the copolymer is less than about 50 mg KOH/g, the developing property deteriorates. If the acid value of the copolymer is greater than about 300 mg KOH/g, even exposed regions may be developed.

The binder may be present in an amount ranging from about 30 to about 80 parts by weight with respect to 100 parts by weight of the organic material. When the binder is present in an amount less than about 30 parts by weight with respect to 100 parts by weight of the organic material, the coating properties and dispersibility of the paste are reduced. When the binder is present in an amount greater than about 80 parts by weight with respect to 100 parts by weight of the organic material, the cross-linking reaction is insufficiently performed during exposure to light, and thus a pattern having the desired shape is not be obtained.

The photo initiator produces radicals as a result of light irradiated by an exposure apparatus, and the produced radicals induce polymerization of the crosslinking agent having an ethylenically unsaturated group to make it insoluble in the developing solution. Since the photo initiator requires high sensitivity, in one embodiment at least two photo initiators may be combined. Nonlimiting examples of suitable photo initiators include imidazole-based compounds, triazine-based compounds, aminoacetophenone-based compounds, benzophenone and acetophenone based compounds, benzoin-based compounds, titanocene-based compounds, oxadiazole-based compounds, thioxanthone-based compounds, (bis)acylphosphineoxide-based compounds, organic boron salt compounds, and combinations thereof.

Nonlimiting examples of suitable imidazole-based compounds include 2,2'-bis(o-chlorophenyl)-4,4',5,5'-tetraphenyl-1,2'-biimidazole, 2,2'-bis(o-bromophenyl)-4,4',5,5'-tetraphenyl-1,2'-biimidazole, 2,2'-bis(o-chlorophenyl)-4,4',5,5'-tetra(o,p-dichlorophenyl)-1,2'-biimidazole, 2,2'-bis(o,p-dichlorophenyl)-4,4',5,5'-tetra(o,p-dichlorophenyl)-1,2'-biimidazole, 2,2'-bis(o-chlorophenyl)-4,4',5,5'-tetra(m-methoxyphenyl)-1,2'-biimidazole, 2,2'-bis(o-methylphenyl)-4,4',5,5'-tetraphenyl-1,2'-biimidazole, and the like.

Nonlimiting examples of suitable triazine-based compounds include 2,4,6-tris(trichloromethyl)-s-triazine, 2,4,6-tris(tribromomethyl)-s-triazine, 2-propynyl-4,6-bis(trichloromethyl)-s-triazine, 2-benzoyl-4,6-bis(trichloromethyl)-s-triazine, 2-(4-chlorophenyl)-4,6-bis(trichloromethyl)-s-triazine, 2-4-bis(4-methoxyphenyl)-6-trichloromethyl)-s-triazine, 2-(4-methoxyphenyl)-4,6-bis(trichloromethyl)-s-triazine, 2-(4-methoxystyryl)-4,6-bis(trichloromethyl)-s-triazine, 2-(4-chlorostyryl)-4,6-bis(trichloromethyl)-s-triazine, 2-(4-aminophenyl)-4,6-bis(trichloromethyl)-s-triazine, 2,4-bis(3-chlorophenyl)-6-trichloromethyl-s-triazine, 2-(4-aminostyryl)-4,6-bis(dichloromethyl)-s-triazine, and the like.

Nonlimiting examples of suitable aminoacetophenone compounds include 2-methyl-2-amino(4-morpholinophenyl)ethan-1-one, 2-ethyl-2-amino(4-morpholinophenyl)ethan-1-one, 2-propyl-2-amino(4-morpholinophenyl)ethan-1-one, 2-butyl-2-amino(4-morpholinophenyl)ethan-1-one, 2-methyl-2-amino(4-morpholinophenyl)propan-1-one, 2-methyl-2-amino(4-morpolynophenyl)butan-1-one, 2-ethyl-2-amino(4-morpholinophenyl)propan-1-one, 2-ethyl-2-amino(4-morpholinophenyl)butan-1-one, 2-methyl-2-methylamino(4-morpholinophenyl)propan-1-one, 2-methyl-2-dimethylamino(4-morpholinophenyl)propan-1-one, 2-methyl-2-diethylamino(4-morpholinophenyl)propan-1-one, and the like.

Nonlimiting examples of suitable benzophenone and acetophenone based compounds include benzophenone, 4-methylbenzophenone, 2,4,6-trimethylbenzophenone, methyl o-benzoylbenzoate, 4-phenylbenzophenone, 3,3'-dimethyl-4-methoxybenzophenone, 4-benzoyl-4'-methyl-diphenylsulfide, 4,4'-bis(N,N-dimethylamino)benzophenone, 4,4'-bis(N,N-diethylamino)benzophenone, 3,3',4,4'-tetra(tert-butylperoxycarbonyl)benzophenone, (2-acryloyloxy ethyl)(4-benzoylbenzyl)dimethylammonium bromide, 4-(3-dimethylamino-2-hydroxypropyl)benzophenone, (4-benzoylbenzyl)trimethylammonium chloride, methochloride monohydrate, diethoxyacetophenone, 2-hydroxy-2-methyl-1-phenylpropan-1-one, 1-(4-isopropylphenyl)-2-methylpropan-1-one, 1-hydroxycyclohexylphenylketone, 4-tert-butyl-trichloroacetophenone, and the like.

Nonlimiting examples of suitable benzoin-based compounds include benzoin, benzoinmethylether, benzomethylether, benzoinisopropylether, benzoinisobutylether, and the like.

Nonlimiting examples of suitable titanocene-based compounds include dicyclopentadienyl-Ti-dichloride, dicyclopentadienyl-Ti-diphenyl, dicyclopentadienyl-Ti-bis(2,3,4,5,6-pentafluorophenyl), dicyclopentadienyl-Ti-bis(2,3,5,6-tetrafluorophenyl), dicyclopentadienyl-Ti-bis(2,4,6-trifluorophenyl), dicyclopentadienyl-Ti-bis(2,6-difluorophenyl), dicyclopentadienyl-Ti-bis(2,4-difluorophenyl), bis(methylcyclopentadienyl)-Ti-bis(2,3,4,5,6-pentafluorophenyl), bis(methylcyclopentadienyl)-Ti-bis(2,3,5,6-tetrafluorophenyl), bis(methylcyclopentadienyl)-Ti-bis(2,4,6-trifluorophenyl), bis(methylcyclopentadienyl)-Ti-bis(2,6-difluorophenyl), bis(methylcyclopentadienyl)-Ti-bis(2,4-difluorophenyl), and the like.

Nonlimiting examples of suitable oxadiazole-based compounds include 2-phenyl-5-trichloromethyl-1,3,4-oxadiazole, 2-(p-methylphenyl)-5-trichloromethyl-1,3,4-oxadiazole, 2-(p-methoxyphenyl)-5-trichloromethyl-1,3,4-oxadiazole, 2-styryl-5-trichloromethyl-1,3,4-oxadiazole, 2-(p-methoxystyryl)-5-trichloromethyl-1,3,4-oxadiazole, 2-(p-butoxystyryl)-5-trichloromethyl-1,3,4-oxadiazole, and the like.

Nonlimiting examples of suitable thioxanthone-based compounds include thioxanthone, 2,4-diethylthioxanthone, isopropyl thioxanthone, 2,4-diisopropylthioxanthone, 2-chlorothioxanthone, 1-chloro-4-propoxythioxanthone, 2-(3-dimethylamino-2-hydroxypropoxy)-3,4-dimethyl-9H-thioxanthon-9-one methochloride, and the like.

Nonlimiting examples of suitable (bis)acylphosphineoxide-based compounds include 2,4,6-trimethylbenzoyldiphenylphosphineoxide; bis(2,6-dimethoxybenzoyl)-2,4,4-trimethylpentylphosphineoxide, bis(2,6-dichlorobenzoyl)phenylphosphineoxide, bis(2,6-dichlorobenzoyl)-2,5-dimethylphenylphosphineoxide, bis(2,4,6-trimethylbenzoyl)phenylphosphineoxide, and the like.

Nonlimiting examples of suitable organic boron salt compounds include quaternary organic boron salt compounds represented by Formula 1 below.

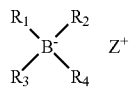

Formula 1

In Formula 1, $Z^+$ represents an arbitrary positive ion, and each of $R_1$, $R_2$, $R_3$, and $R_4$ is independently selected from substituted and unsubstituted alkyl groups, substituted and unsubstituted aryl groups, substituted and unsubstituted aralkyl groups, substituted and unsubstituted alkenyl groups, substituted and unsubstituted alkynyl groups, substituted and unsubstituted silyl groups, substituted and unsubstituted heterocyclic groups, and halogen atoms.

The organic boron salt compound comprises a quaternary organic boron negative ion and a positive ion, $Z^+$. In Formula 1, each of $R_1$, $R_2$, $R_3$, and $R_4$ is independently selected from substituted and unsubstituted alkyl groups, substituted and unsubstituted aryl groups, substituted and unsubstituted aralkyl groups, substituted and unsubstituted alkenyl groups, substituted and unsubstituted alkynyl groups, substituted and unsubstituted silyl groups, substituted and unsubstituted heterocyclic groups, and halogen atoms. For substituted groups, the substituents may be selected from methyl groups, ethyl groups, n-propyl groups, isopropyl groups, n-butyl groups, sec-butyl groups, isobutyl groups, tert-butyl groups, n-octyl groups, n-dodecyl groups, cyclopentyl groups, cyclohexyl groups, phenyl groups, tolyl groups, xylyl groups, anisyl groups, biphenyl groups, diphenylmethyl groups, methoxy groups, ethoxy groups, n-protoxy groups, isoprotoxy groups, n-butoxy groups, sec-butoxy groups, isobutoxy groups, tert-butoxy groups, methylenedioxy groups, ethylenedioxy groups, phenoxy groups, naphthyloxy groups, benzyloxy groups, methylthio groups, phenylthio groups, 2-furyl groups, 2-thienyl groups, 2-pyridyl groups, boron groups, and the like.

Nonlimiting examples of suitable quaternary organic boron negative ions of the organic boron salt compound include methyltriphenylborate, n-butyltriphenylborate, n-octyltriphenylborate, n-dodecyltriphenylborate, sec-butyltriphenylborate, tert-butyltriphenylborate, benzyltriphenylborate, n-butyltri(p-anisyl)borate, n-octyltri(p-anisyl)borate, n-dodecyltri(p-anisyl)borate, n-butyltri(p-tolyl)borate, n-butyltri(o-tolyl)borate, n-butyltri(4-tert-butylphenyl)borate, n-butyltri(4-fluoro-2-methylphenyl)borate, n-butyltri(4-fluorophenyl)borate, n-butyltri(1-naphthyl)borate, ethyltri(1-naphthyl)borate, n-butyltri[1-(4-methylnaphthyl)]borate, methyltri[1-(4-methylnaphthyl)]borate, triphenylsilyltriphenylborate, trimethylsilyltriphenylborate, tetra-n-butylborate, di-n-butyldiphenylborate, tetrabenzylborate, and the like. In one embodiment, one of $R_1$, $R_2$, $R_3$, and $R_4$ of the quaternary organic boron negative ion, for example, $R_1$, may be an alkyl group, and the remaining R groups, for example, $R_2$, $R_3$, and $R_4$ may be naphthyl groups in order to maintain a balance of stability and photoreactivity of the organic boron salt compound.

Nonlimiting examples of suitable positive ions ($Z^+$) of the organic boron salt compound include tetramethylammonium, tetraethylammonium, tetra-n-butylammonium, tetraoctylammonium, N-methylquinolium, N-ethylquinolium, N-methylpyridinium, N-ethylpyridinium, tetramethylphosphonium, tetra-n-butylphosphonium, trimethylsulfonium, triphenylsulfonium, trimethylsulfoxonium, diphenyliodonium, di(4-tert-butylphenyl)iodonium, Li positive ions, Na positive ions, K positive ions, and the like.

The photo initiator may be used in combination with a sensitizer for obtaining higher sensitivity. The selection of the sensitizer depends on the photo initiator, and some of the photo initiators described above may also function as a sensitizer of other photo initiators. For example, when an imidazole-based photo initiator is used, a benzophenone-based or thioxanthone-based compound functions as both a photo initiator and a sensitizer, and thus may be used in combination with the imidazole-based photoinitiator. A sensitizer that can be used in combination with the organic boron salt compound may be any material that can absorb light and decompose the organic boron salt compound. Compounds performing such functions include benzophenone-based compounds, thioxanthone-based compounds, quinone-based compounds, and positive ionic dyes. The benzophenone-based compound and the thioxanthone-based compound may be selected from the compounds described above. Nonlimiting examples of suitable quinone-based compounds include quinhydrone, 2,5-dichloro-1,4-benzoquinone, 2,6-dichloro-1,4-benzoquinone, phenyl-1,4-benzoquinone, 2-methyl-1,4-naphthoquinone, 2,3-dichloro-1,4-naphthoquinone, 2-hydroxy-1,4-naphthoquinone, 5-hydroxy-1,4-naphthoquinone, 2-amino-3-chloro-1,4-naphthoquinone, 2-chloro-3-morpholino-1,4-naphthoquinone, anthraquinone, 2-methylanthraquinone, 2-ethylanthraquinone, 2-tert-butylanthraquinone, 2,3-dimethylanthraquinone, 1-chloroanthraquinone, 2-chloroanthraquinone, 1,4-dichloroanthraquinone, 2-(hydroxymethyl)anthraquinone, 9,10-phenanthrenequinone, and the like. The positive ionic dyes may be dyes having maximum absorption wavelengths ranging from about 300 nm to near-infrared wavelengths, and may be generally yellow, orange, red, green or blue. Nonlimiting examples of suitable positive ionic dyes include Basic yellow 11, Astrazon orange G, Thioflavin T, Auramine O, Indocyanine green, 1,1',3,3,3',3'-hexamethylindocarbocyanine iodine, IR-786 perchlorate and the like.

The photo initiator may be present in an amount ranging from about 1 to about 20 parts by weight with respect to 100 parts by weight of the organic material. When the photo initiator is present in an amount less than about 1 part by weight with respect to 100 parts by weight of the organic material, light exposure sensitivity is reduced. When the photo initiator is present in an amount greater than about 20 parts by weight with respect to 100 parts by weight of the organic material, even unexposed regions are not developed.

The cross-linking agent can comprise mono(meth)acrylates and multi-functional acrylates. Nonlimiting examples of suitable mono(meth)acrylates include (meth)acrylic acid, methyl (meth)acrylate, ethyl (meth)acrylate, n-propyl (meth)acrylate, isopropyl (meth)acrylate, n-butyl (meth)acrylate, sec-butyl (meth)acrylate, isobutyl (meth)acrylate, tert-butyl (meth)acrylate, n-pentyl (meth)acrylate, allyl (meth)acrylate, phenyl (meth)acrylate, benzyl (meth)acrylate, butoxyethyl (meth)acrylate, butoxytriethyleneglycol (meth)acrylate, cyclohexyl (meth)acrylate, dicyclopentanyl (meth)acrylate, dicyclopentenyl (meth)acrylate, 2-ethylhexyl (meth)acrylate, glycerol (meth)acrylate, glycidyl (meth)acrylate, isobornyl (meth)acrylate, isodexyl (meth)acrylate, isooctyl (meth) acrylate, lauryl (meth)acrylate, 2-methoxyethyl (meth)acrylate, methoxyethyleneglycol (meth)acrylate, methoxydiethyleneglycol (meth)acrylate, phenoxyethyl (meth)acrylate, stearyl (meth)acrylate, 1-naphthyl (meth)acrylate, 2-naphthyl (meth)acrylate, 2-hydroxyethyl (meth)acrylate, 2-hydroxypropyl (meth)acrylate, aminoethyl (meth)acrylate, and the like. Nonlimiting examples of suitable multi-functional acrylates include di(meth)acrylates (such as 1,6-hexanediol diacrylate, (ethoxylated) 1,6-hexanediol di(meth)acrylate, 1,4-butanediol di(meth)acrylate, 2-butyl-2-ethyl-1,3-propanediol di(meth)acrylate, 1,9-nonanediol di(meth)acrylate, tripropyleneglycol di(meth)acrylate, dipropyleneglycol di(meth)acrylate, tetraethyleneglycol di(meth)acrylate, (ethoxylated)$_n$ (n=2 to 8) bisphenol A di(meth)acrylate, or bisphenol A epoxy di(meth)acrylate), tri(meth)acrylates (such as trimethylolpropane tri(meth)acrylate, (ethoxylated) trimethylolpropane tri(meth)acrylate, (propoxylated) glycerin tri(meth)acrylate, pentaerythritol tri(meth)acrylate, or (propoxylated) trimethylolpropane-3-tri(meth)acrylate), tetra(meth)acrylates (such as ditrimethylolpropane tetra(meth) acrylate, tetramethylolpropane tetra(meth)acrylate, or pentaerythritol tetra(meth)acrylate), penta(meth)acrylates (such as dipentaerythritol penta(meth)acrylate), hexa(meth)acrylates (such as dipentaerythritol hexa(meth)acrylate), and the like. The cross-linking agent may be at least one selected from mono and multi-functional acrylates.

The cross-linking agent may be present in an amount ranging from about 15 to about 60 parts by weight with respect to 100 parts by weight of the organic material. When the cross-linking agent is present in an amount less than about 15 parts by weight with respect to 100 parts by weight of the organic material, light exposure sensitivity is reduced. When the cross-linking agent is present in an amount greater than about 60 parts by weight with respect to 100 parts by weight of the organic material, the barrier rib may detach or disconnect during sintering.

The photosensitive paste composition may further comprise additives. The additives can include polymerization inhibitors and antioxidants for improving storage stability of the photosensitive paste compound, ultraviolet absorbents for improving resolution, antifoaming agents for reducing air bubbles in the composition, dispersants for improving dispersibility, leveling agents for improving smoothness of the membrane during printing, plasticizers for improving thermal decomposition characteristics, thixotropic agents for providing thixotropy characteristics, and the like.

The solvent may be any solvent that does not reduce dispersibility of the metal oxide, dissolves the binder and the photo initiator, is satisfactorily mixed with the cross-linking agent and extra additives, and has a boiling point of at least about 150° C. When the boiling point of the solvent is less than about 150° C., the possibility of volatilization is high during preparation of the photosensitive paste compound, particularly in a 3-roll milling process, and the solvent is volatilized so quickly during printing that the print state is not good. Nonlimiting examples of suitable solvents satisfying these conditions include ethyl carbitol, butyl carbitol, ethyl carbitol acetate, butyl carbitol acetate, texanol, terpine oil, diethylene glycol, dipropylene glycol, tripropylene glycol, dipropyleneglycol methylether, dipropyleneglycol ethylether, dipropyleneglycol monomethylether acetate, γ-butyrolactone, cellosolve acetate, butyl cellosolve acetate, and combinations thereof.

The amount of the solvent is not particularly limited, but the solvent is used in an amount sufficient to provide a viscosity suitable for printing or coating.

According to one embodiment of the present invention, the photosensitive paste composition is prepared by the following method. First, an organic-inorganic complex sol is prepared by preparing an organic-inorganic complex and then dispersing it in an organic material. The organic material includes a binder, a photo initiator, a cross-linking agent and additives, and may include a solvent if needed. The organic material is prepared as a uniform and transparent solution such that each component of the organic material is mixed and fully stirred.

The prepared organic-inorganic complex sol is mixed with an inorganic material to prepare a paste. Subsequently, the paste is mixed using a planetary mixer (PLM) or the like, and then mechanically mixed by 3-roll milling many times. When the process of 3-roll milling is terminated, the resulting product is filtered using SUS mesh #400, and then degassed using a vacuum pump to prepare a photosensitive paste composition.

According to another embodiment of the present invention, a barrier rib of a plasma display panel (PDP) is prepared using the photosensitive paste composition.

In another embodiment, a method of preparing a barrier rib of a PDP using the photosensitive paste composition is includes coating the photosensitive paste composition on a lower substrate of a PDP on which address electrodes and a dielectric layer are formed. The composition is coated screen printing or table coating, and dried in a dry oven or an IR oven at about 80 to about 120° C. for about 5 to about 60 minutes to remove the majority of solvent from the photosensitive paste composition. Then, light is irradiated onto the dried film using an ultraviolet exposure device in which a photomask is installed. A portion of the dried film onto which ultraviolet rays are irradiated becomes insoluble in the developing solution through cross-linking. During development, an appropriate alkaline developing solution is used, such as a $Na_2CO_3$ solution, a KOH solution, a TMAH solution, a monoethanolamine solution or the like. The developing solution is diluted in pure water and used at a developing temperature of about 30° C. to remove unexposed portions of the photosensitive paste. As a result, a pattern is obtained. The resulting product is sintered in an electric furnace at about 500 to about 600° C. for about 5 to about 60 minutes to remove remaining organic substances and sinter the low melting point glass frits. Accordingly, a patterned barrier rib can be obtained.

According to yet another embodiment of the present invention, a PDP includes the barrier rib. FIG. 1 illustrates a PDP including a barrier rib prepared from a photosensitive paste composition according to an embodiment of the present invention. The PDP includes a front panel 110 and a rear panel 120. The front panel 110 includes a front substrate 111; sustain electrode pairs (114 for each) formed on a rear surface 111a of the front substrate 111, each sustain electrode pair 114 including a Y electrode 112 and an X electrode 113; a front dielectric layer 115 covering the sustain electrode pairs; and a protective layer 116 covering the front dielectric layer 115. The Y electrode 112 and the X electrode 113 respectively include transparent electrodes 112b and 113b made of ITO, etc., and bus electrodes 112a and 113a each including a black electrode (not shown) for contrast enhancement and a white electrode (not shown) for imparting conductivity. The bus electrodes 112a and 113a are connected to connection cables disposed on the left and right sides of the PDP.

The rear panel 120 includes a rear substrate 121; address electrodes 122 formed on a front surface 121a of the rear substrate 121 intersecting the sustain electrode pairs; a rear dielectric layer 123 covering the address electrodes; barrier ribs 124 formed on the rear dielectric layer 123 to partition discharge cells 126; and a phosphor layer 125 disposed in each discharge cell. The address electrodes 122 are connected to connection cables disposed on upper and lower sides of the PDP.

The present invention will now be described with reference to the following Examples. The following Examples are presented for illustrative purposes only and are not intended to limit the scope of the invention.

EXAMPLES

Preparation of Organic-Inorganic Complex

Example 1

Preparation of Tantalum Oxide Organic-Inorganic Complex 1-1. Preparation of Tantalum Oxide To hydrolyze and condense tantalum (V) ethoxide, 100 ml of n-BuOH and 1.40 g of pure water as a solvent were added to a reactor. While the mixture was stirred, 0.017 mole of HCl was slowly added thereto. After stirring for about 30 minutes, 5.28 g (0.013 mole) of tantalum (V) ethoxide (purity 99.9%) was slowly added to the mixture while the mixture was stirred. Subsequently, the resulting product was hydrolyzed and condensed to prepare tantalum oxide by stirring at room temperature for 24 hours.

1-2. Preparation of Tantalum Oxide Organic-Inorganic Complex

The tantalum oxide was subjected to a surface modification reaction by the following procedure using 3-(methacryloyloxy)propyltrimethoxysilane (MPTS) as a surface modifier.

0.323 g of MPTS (0.0013 mole) was added to 50 g of n-BuOH while stirring and mixing. The prepared tantalum oxide was slowly added thereto while the mixture was stirred. 0.1 g of 0.1 N HCl was then additionally added to the mixture in order to facilitate hydrolysis of MPTS and reaction with the tantalum precursor. Subsequently, the mixture was refluxed for 1 hour to complete the reaction. Then, solvent substitution was performed using 100 ml of diethylene glycol to substitute the remaining solvent and pure water with diethylene glycol. The resulting product was purified using an ion exchange resin to prepare an organic-inorganic complex of tantalum oxide that was dispersed in diethylene glycol.

Example 2

Preparation of Titanium Oxide Organic-Inorganic Complex 2-1. Preparation of Titanium Oxide 50 g (0.176 mole) of Titanium tetraisopropoxide (Ti(OPr)$_4$) was added to a reactor and stirred. While stirred, a mixed solution of 50 g of tetrahydrofuran (THF) and 10 ml of 1N HCl was slowly added thereto. Subsequently, the mixture was hydrolyzed and condensed to prepare a titanium oxide by stirring until it became transparent.

2-2. Preparation of Titanium Oxide Organic-Inorganic Complex

Triethoxysilane-capped polyarylene ether sulfone (triethoxysilane-capped PSF) was used as a surface modifier of the titanium oxide. Triethoxysilane-capped PSF was prepared through a reaction of (3-isocyanatopropyl)triethoxysilane and amine-end capped PSF.

The titanium oxide was subjected to a surface modification reaction by the following procedure.

While the prepared titanium precursor was stirred, 10 g of triethoxysilane-capped PSF (made into a 10 weight % solution by dissolution in dimethylformamide (DMF)) was slowly added thereto. After the addition was terminated, the mixture was stirred for 1 hour to complete a reaction of titanium oxide and triethoxysilane-capped PSF. Then, solvent substitution was performed using 100 ml of diethylene glycol to substitute the remaining solvent and pure water with diethylene glycol. The resulting product was purified using an ion exchange resin to prepare an organic-inorganic complex of titanium oxide that was dispersed in diethylene glycol.

Example 3

Preparation of Zirconium Oxide Organic-Inorganic Complex 3-1. Preparation of Zirconium Oxide 50 g (0.153 mole) of zirconium tetra-n-propoxide (Zr(OPr)$_4$) was added to a reactor and stirred. While stirred, a mixed solution of 50 g of THF and 0.87 ml of 10N HCl was slowly added thereto. Subsequently, the mixture was hydrolyzed and condensed to prepare a zirconium oxide by stirring until it became transparent.

3-2. Preparation of Zirconium Oxide Organic-Inorganic Complex

The triethoxysilane-capped PSF used in Example 2-2 was also used as a surface modifier of the zirconium oxide, and the zirconium oxide was subjected to a surface modification reaction as in Example 2-2 to prepare an organic-inorganic complex of zirconium oxide.

Example 4

Preparation of Titanium-Zirconium Oxide Organic-Inorganic Complex 4-1. Preparation of Titanium-Zirconium Oxide The titanium oxide of Example 2-1 and the zirconium oxide of Example 3-1 were mixed half and half to prepare a titanium-zirconium oxide.

4-2. Preparation of Titanium-Zirconium Oxide Organic-Inorganic Complex

The triethoxysilane-capped PSF used in Example 2-2 was also used as a surface modifier of the titanium-zirconium oxide, and the titanium-zirconium oxide was subjected to a surface modification reaction as in Example 2-2 to prepare an organic-inorganic complex of titanium-zirconium oxide.

Physical Property Evaluation of Organic-Inorganic Complexes

Refractive indices of the four organic-inorganic complexes prepared in Examples 1 through 4 were measured at 20° C. using an Abbe refractometer, and specific gravities thereof were measured at 20° C. using a gravimeter. In addition, particle diameters of the prepared organic-inorganic complexes were measured using photon correlation spectroscopy (PCS). The results are shown in Table 1 below.

TABLE 1

| Organic-inorganic complex | Refractive index (@20° C.) | Specific gravity (@20° C.) | Average particle diameter (nm) |
|---|---|---|---|
| Example 1 | 2.09 | 7.95 | 7.7 |
| Example 2 | 2.31 | 3.76 | 9.8 |
| Example 3 | 1.99 | 5.58 | 7.4 |
| Example 4 | 2.16 | 4.67 | 9.2 |

Preparation of Organic Material

An organic material for mixing with the prepared organic-inorganic complexes was prepared.

Example 5

Preparation of Organic Material 1

Organic material 1 was prepared using 35.0% by weight of a poly(methylmethacrylate-co-butylacrylate-co-methacrylic acid) copolymer having a molecular weight of 9,000 g/mol and an acid value of 170 mg KOH/g as a binder, 1.0% by weight of bis(2,4,6-trimethylbenzoyl)phenylphosphineoxide as a photo initiator, 14.0% by weight of phenoxyethyl acrylate as a first cross-linking agent, 14.0% by weight of bisphenol A modified diacrylate as a second cross-linking agent, 6.0% by weight of benzotriazole as a storage stabilizer, and 30.0% by weight of ethylcarbitol as a solvent.

Example 6

Preparation of Organic Material 2

Organic material 2 was prepared using 34.0% by weight of a poly(styrene-co-butyl acrylate-co-methyl methacrylic acid) copolymer having a molecular weight of 12,000 g/mol and an acid value of 220 mg KOH/g as a binder, 4.0% by weight of 2-methyl-1-[4-(methylthio)phenyl]-2-morpholinopropan-1-one as a first photo initiator, 1.0% by weight of 2,4-diethylthioxantone as a second photo initiator, 24.0% by weight of bisphenol A modified epoxy diacrylate as a cross-linking agent, 6.0% by weight of benzotriazole as a storage stabilizer, and 31.0% by weight of ethylcarbitol as a solvent.

Physical Property Evaluation of Organic Material

Refractive indices of the organic materials prepared in Examples 5 and 6 were measured using an Abbe refractometer, and specific gravities thereof were measured using a hydrometer.

TABLE 2

| Organic material | Refractive index (@20° C.) | Specific gravity (@20° C.) |
|---|---|---|
| Example 5 | 1.53 | 1.07 |
| Example 6 | 1.56 | 1.12 |

Preparation of Organic-Inorganic Complex Sol

The organic-inorganic complexes of Examples 1 through 4 were mixed with the organic materials of Examples 5 and 6 to prepare organic-inorganic complex sols. In further detail, the organic material was added to a stirrer and stirred. While stirring, the organic-inorganic complex was added thereto, and the mixture was stirred for two hours to prepare a transparent mixture. The volume ratios given in Examples 7 through 10 denote volume ratios of the components in the absence of solvent.

Example 7

Preparation of Organic-Inorganic Complex Sol 1

The tantalum oxide organic-inorganic complex of Example 1 and the organic material 1 of Example 5 were mixed in a volume ratio of 15:85. The refractive index measured after mixing was 1.62.

Example 8

Preparation of Organic-Inorganic Complex Sol 2

The titanium oxide organic-inorganic complex of Example 2 and the organic material 1 of Example 5 were mixed in a volume ratio of 15:85. The refractive index measured after mixing was 1.65.

Example 9

Preparation of Organic-Inorganic Complex Sol 3

The zirconium oxide organic-inorganic complex of Example 3 and the organic material 2 of Example 6 were mixed in a volume ratio of 15:85. The refractive index measured after mixing was 1.63.

Example 10

Preparation of Organic-Inorganic Complex Sol 4

The titanium-zirconium oxide organic-inorganic complex of Example 4 and the organic material 2 of Example 6 were mixed in a volume ratio of 15:85. The refractive index measured after mixing was 1.65.

Preparation of Photosensitive Paste Composition

The organic-inorganic complex sols prepared in Examples 7 through 10 were mixed with an inorganic material comprising a low melting point glass frit and a high melting point glass frit, as described below to prepare photosensitive paste compositions.

Example 11

Preparation of Photosensitive Paste Composition 1

A photosensitive paste composition 1 was prepared using 40% by volume of the organic-inorganic complex sol 1 of Example 7, 55% by volume of a low melting point glass frit ($ZnO$—$SiO_2$—$B_2O_3$ based, amorphous, $D_{50}$=3.2 µm, refractive index=1.65), and 5% by volume of a high melting point glass frit ($SiO_2$—$B_2O_3$—$BaO$ based, amorphous, $D_{50}$=2.5 µm, refractive index=1.65).

Example 12

Preparation of Photosensitive Paste Composition 2

A photosensitive paste composition 2 was prepared as in Example 11, except that the organic-inorganic complex sol 2 of Example 8 was used instead of the organic-inorganic complex sol 1 of Example 7.

Example 13

Preparation of Photosensitive Paste Composition 3

A photosensitive paste composition 3 was prepared in the same manner as in Example 11, except that the organic-inorganic complex sol 3 of Example 9 was used instead of the organic-inorganic complex sol 1 of Example 7.

Example 14

Preparation of Photosensitive Paste Composition 4

A photosensitive paste composition 4 was prepared in the same manner as in Example 11, except that the organic-inorganic complex sol 4 of Example 10 was used instead of the organic-inorganic complex sol 1 of example 7.

Comparative Example 1

Preparation of Conventional Photosensitive Paste Composition

A conventional photosensitive paste composition was prepared using 40% by volume of the organic material 2 of Example 6, 50% by volume of a low melting point glass frit ($SiO_2$—BaO—$B_2O_3$—$Li_2O$ based, amorphous, $D_{50}$=3.2 μm, refractive index=1.56), and 10% by volume of a high melting point glass frit ($SiO_2$—$B_2O_3$—CaO based, amorphous, $D_{50}$=3.0 μm, refractive index=1.55).

Evaluation and Results of Photosensitive Paste Compositions

Each of the photosensitive paste compositions of Examples 11 through 14 and Comparative Example 1 was coated on a 6" glass substrate using a coater, and then dried in a dry oven at 80° C. for 60 minutes. Subsequently, 300-1000 mJ/cm$^2$ of light was irradiated using a high voltage mercury lamp ultraviolet exposure device equipped with a photomask having a grating pattern with a line width of 40 μm and a pitch of 160 μm in the lateral direction, and a line width of 40 μm and a pitch of 560 μm in the longitudinal direction. The light-irradiated glass substrate was developed by spraying it with 0.4% by weight aqueous $NaCO_3$ solution at 30° C. at a nozzle pressure of 1.2 kgf/cm$^2$ for 120 seconds. The substrate was then rinsed by spraying it with pure water at room temperature at a nozzle pressure of 1.2 kgf/cm$^2$ for 30 seconds. Subsequently, the developed glass substrate was dried using an air knife and then placed into an electric furnace and sintered at 570° C. for 20 minutes to form a barrier rib. Then, the formed barrier rib was evaluated using an optical microscope and SEM. The results are shown in Table 3 below. In Table 3, "exposure amount" is a value denoting optimum pattern results.

TABLE 3

| Paste composition | Exposure amount (mJ/cm$^2$) | Sintered film thickness (μm) | Upper width (after sintering) (μm) | Lower width (after sintering) (μm) |
|---|---|---|---|---|
| Example 11 | 700 | 122 | 41 | 48 |
| Example 12 | 350 | 124 | 35 | 59 |
| Example 13 | 650 | 125 | 39 | 53 |
| Example 14 | 350 | 122 | 36 | 60 |
| Comparative Example 1 | 350 | 122 | 35 | 60 |

As shown in Table 3, light exposure sensitivity (exposure amount) largely depends on the difference between the refractive index of the organic-inorganic complex sol and the refractive index of the inorganic material. That is, the smaller the difference between the refractive indices of the organic-inorganic complex sol and the inorganic material, the better light exposure sensitivity. In addition, as shown in Table 3, the lower the light exposure sensitivity, the wider the upper width and the narrower the lower width. This is because the bigger the difference between the refractive indices of the organic-inorganic complex sol and the inorganic material, the lower the transmittance of light irradiated during exposure, while reflection and scattering increase.

Manufacture of PDPs and Evaluation of Characteristics Thereof

Each of the photosensitive paste compositions of Examples 12 and 14 was used to manufacture a 6" panel. In addition, for characteristic comparison, a panel was manufactured using the photosensitive paste composition of Comparative Example 1.

Each 6" panel was manufactured as part of a pilot line, and had specs for a 42" HD type panel. Luminances of the panels are reported in Table 4 below.

TABLE 4

| Paste composition | Measured luminance (lm/W) | Relative ratio of luminance |
|---|---|---|
| Example 12 | 1.29 | 115 |
| Example 14 | 1.34 | 120 |
| Comparative Example 1 | 1.12 | 100 |

From the luminance results shown in Table 4, it can be seen that when the photosensitive paste composition according to the present invention is used, luminance is increased by about 15-20% as compared to the paste of Comparative Example 1. As described above, this is because the metal oxide of the organic-inorganic complex increases the reflective index of the barrier rib, thereby increasing luminance.

According to the present invention, barrier ribs for PDPs having high resolution and high precision can be made by exposure to light only once, and barrier ribs having higher reflective indices than conventional barrier ribs can also be obtained.

While the present invention has been illustrated and described with reference to certain exemplary embodiments, it will be understood by those of ordinary skill in the art that various modifications and changes to the described embodiments may be made without departing from the spirit and scope of the present invention as defined by the following claims.

What is claimed is:

1. A photosensitive paste composition comprising an organic-inorganic complex sol and an inorganic material, wherein an average refractive index ($N_1$) of the organic-inorganic complex sol and an average refractive index ($N_2$) of the inorganic material satisfy Equation 1:

$$-0.2 \leq N_1 - N_2 \leq 0.2,$$  Equation 1 wherein the organic-inorganic complex sol comprises an organic-inorganic complex dispersed in an organic material, wherein the organic-inorganic complex comprises a metal oxide coated with a surface modifier, the metal oxide comprising a hydrolysis and condensation reaction product of a metal alkoxide or metal halide.

2. The photosensitive paste composition of claim 1, wherein the metal oxide is selected from the group consisting of oxides of Si, oxides of Ti, oxides of Al, oxides of Zr, oxides of Ta, oxides of Ge, oxides of Y, oxides of Zn, and combinations thereof.

3. The photosensitive paste composition of claim 1, wherein the surface modifier is selected from the group consisting of tetraethylorthosilicate (TEOS), (3-methacryloyloxy)propyltrimethoxysilane (MPTS), 3-glycidyloxypropyltrimethoxysilane (GPTS), diphenyldimethoxysilane (DPDMS), diphenylsilanediol (DPSD), and combinations thereof.

4. The photosensitive paste composition of claim 1, wherein the surface modifier is selected from the group consisting of triethoxysilane-capped PEK and triethoxysilane-capped PSF.

5. The photosensitive paste composition of claim 1, wherein the organic-inorganic complex of the organic-inorganic complex sol has an average particle diameter ranging from about 1 to about 60 nm.

6. The photosensitive paste composition of claim 1, wherein the organic-inorganic complex has an average refractive index ranging from about 1.3 to about 3.0.

7. The photosensitive paste composition of claim 1, wherein the organic-inorganic complex sol has an average refractive index ranging from about 1.4 to about 2.0.

8. The photosensitive paste composition of claim 1, wherein the organic-inorganic complex is present in the organic-inorganic complex sol in an amount ranging from about 5 to about 50 parts by volume with respect to 100 parts by volume of the organic material.

9. The photosensitive paste composition of claim 1, wherein the metal oxide is present in the organic-inorganic metal complex sol in an amount ranging from about 3 to about 30 parts by volume with respect to 100 parts by volume of the inorganic material in the photosensitive paste composition.

10. The photosensitive paste composition of claim 1, wherein an average refractive index of the inorganic material ranges from about 1.5 to about 1.8.

11. The photosensitive paste composition of claim 1, wherein the inorganic material comprises a low melting point glass frit and a high melting point glass frit, wherein the low melting point glass frit is present in an amount ranging from about 70 to less than 100 parts by volume with respect to 100 parts by volume of the inorganic material, and wherein the high melting point glass frit is present in an amount ranging from greater than 0 to less than about 30 parts by volume with respect to 100 parts by volume of the inorganic material.

12. The photosensitive paste composition of claim 11, wherein the low melting point glass frit is selected from the group consisting of PbO—$B_2O_3$ based glasses, PbO—$SiO_2$—$B_2O_3$ based glasses, $Bi_2O_3$—$B_2O_3$ based glasses, $Bi_2O_3$—$SiO_2$—$B_2O_3$ based glasses, $SiO_2$—$B_2O_3$—$Al_2O_3$ based glasses, $SiO_2$—$B_2O_3$—BaO based glasses, $SiO_2$—$B_2O_3$—CaO based glasses, ZnO—$B_2O_3$—$Al_2O_3$ based glasses, ZnO—$SiO_2$—$B_2O_3$ based glasses, $P_2O_5$ based glasses, SnO—$P_2O_5$ based glasses, $V_2O_5$—$P_2O_5$ based glasses, $V_2O_5$—$Mo_2O_3$ based glasses, $V_2O_5$—$P_2O_5$—$TeO_2$ based glasses, and combinations thereof.

13. The photosensitive paste composition of claim 11, wherein the high melting point glass frit is selected from the group consisting of $SiO_2$—$B_2O_3$—BaO based glasses, $SiO_2$—$B_2O_3$—CaO based glasses, $SiO_2$—$B_2O_3$—MgO based glasses, $SiO_2$—$B_2O_3$—CaO—BaO based glasses, $SiO_2$—$B_2O_3$—CaO—MgO based glasses, $SiO_2$—$Al_2O_3$—BaO based glasses, $SiO_2$—$Al_2O_3$—CaO based glasses, $SiO_2$—$Al_2O_3$—MgO based glasses, $SiO_2$—$Al_2O_3$—BaO—CaO based glasses, $SiO_2$—$Al_2O_3$—CaO—MgO based glasses, and combinations thereof.

14. The photosensitive paste composition of claim 11, wherein the low melting point glass frit and the high melting point glass frit each have an average refractive index ranging from about 1.5 to about 1.8, and wherein a difference between a refractive index ($N_3$) of the low melting point glass frit and a refractive index ($N_4$) of the high melting point glass frit satisfies Equation 7:

$$-0.2 \leq N_3 - N_4 \leq 0.2 \quad \text{Equation 7.}$$

15. The photosensitive paste composition of claim 1, wherein the organic material comprises a binder, a photo initiator and a cross-linking agent, wherein the binder is present in an amount ranging from about 30 to about 80 parts by weight with respect to 100 parts by weight of the organic material, the photo initiator is present in an amount ranging from about 1 to about 20 parts by weight with respect to 100 parts by weight of the organic material, and the cross-linking agent is present in an amount ranging from about 15 to about 60 parts by weight with respect to 100 parts by weight of the organic material.

16. The photosensitive paste composition of claim 15, wherein the binder comprises an acryl-based resin having a carboxyl group, the acryl-based resin comprising a copolymer of a monomer having a carboxyl group and at least one monomer having an ethylenically unsaturated group,
    wherein the binder has a weight average molecular weight ranging from about 500 to about 100,000 g/mol, and an acid value ranging from about 50 to about 300 mg KOH/g,
    the monomer having a carboxyl group being selected from the group consisting of acrylic acids, methacrylic acids, fumaric acids, maleic acids, vinylacetic acids, anhydrides thereof, and combinations thereof, and
    the ethylenically unsaturated monomer being selected from the group consisting of methyl(meth)acrylates, ethyl(meth)acrylates, n-propyl(meth)acrylates, isopropyl(meth)acrylates, n-butyl(meth)acrylates, sec-butyl(meth)acrylates, isobutyl(meth)acrylates, tert-butyl(meth)acrylates, n-pentyl(meth)acrylates, allyl(meth)acrylates, phenyl(meth)acrylates, benzyl(meth)acrylates, butoxyethyl(meth)acrylates, butoxytriethyleneglycol(meth)acrylates, cyclohexyl(meth)acrylates, dicyclopentanyl(meth)acrylates, dicyclopentenyl(meth)acrylates, 2-ethylhexyl(meth)acrylates, glycerol(meth)acrylates, glycidyl(meth)acrylates, isobornyl(meth)acrylates, isodexyl(meth)acrylates, isooctyl(meth)acrylates, lauryl(meth)acrylates, 2-methoxyethyl(meth)acrylates, methoxyethyleneglycol(meth)acrylates, methoxydiethyleneglycol(meth)acrylates, phenoxyethyl(meth)acrylates, stearyl(meth)acrylates, 1-naphthyl(meth)acrylates, 2-naphthyl(meth)acrylates, 2-hydroxyethyl(meth)acrylates, 2-hydroxypropyl(meth)acrylates, aminoethyl(meth)acrylates, styrenes, α-methastyrenes, α-2-dimethylstyrenes, 3-methylstyrenes, 4-methylstyrenes, and combinations thereof.

17. The photosensitive paste composition of claim 16, wherein the binder comprises a cross-linkable group comprising a reaction product of the carboxylic group of the copolymer and an ethylenically unsaturated compound, wherein the ethylenically unsaturated compound is selected from the group consisting of acryloylchloride, methacryloylchloride, allylchloride, glycidylacrylate, glycidylmethacrylate, 3,4-epoxycyclohexylmethylacrylate, and 3,4-epoxycyclohexylmethylmethacrylate.

18. The photosensitive paste composition of claim 16, wherein the binder further comprises a material selected from the group consisting of cellulose, methylcellulose, ethylcellulose, n-propylcellulose, hydroxyethylcellulose, 2-hydroxyethylcellulose, methyl-2-hydroxyethylcellulose, hydroxypropylcellulose, hydroxypropylmethylcellulose, hydroxybutylmethylcellulose, hydroxypropylmethylcellulose phthalate, cellulose nitrate, cellulose acetate, cellulose triacetate, cellulose acetate butyrate, cellulose acetate hydrogenphthalate, cellulose acetate propionate, cellulose propionate, (acrylamidomethyl)cellulose acetate propionate, (acrylamidomethyl)cellulose acetate butyrate, cyanoethylated cellulose, pectic acid, chitosan, chitin, carboxymethylcellulose, carboxymethylcellulose sodium salt, carboxyethylcellulose, and carboxyethylmethylcellulose.

19. The photosensitive paste composition of claim 15, wherein the photo initiator is selected from the group consisting of imidazole-based compounds, triazine-based compounds, aminoacetophenone-based compounds, benzophenone and acetophenone based compounds, benzoin-based compounds, titanocene-based compounds, oxadiazole-based compounds, thioxanthone-based compounds, (bis)acylphosphineoxide-based compounds, organic boron salt compounds, and mixtures thereof.

20. The photosensitive paste composition of claim 15, wherein the cross-linking agent is selected from the group consisting of:
monoacrylates selected from the group consisting of (meth)acrylic acid, methyl (meth)acrylate, ethyl (meth)acrylate, n-propyl (meth)acrylate, isopropyl (meth)acrylate, n-butyl (meth)acrylate, sec-butyl (meth)acrylate, isobutyl (meth)acrylate, tert-butyl (meth)acrylate, n-pentyl (meth)acrylate, allyl (meth)acrylate, phenyl (meth)acrylate, benzyl (meth)acrylate, butoxyethyl (meth)acrylate, butoxytriethyleneglycol (meth)acrylate, cyclohexyl (meth)acrylate, dicyclopentanyl (meth)acrylate, dicyclopentenyl (meth)acrylate, 2-ethylhexyl (meth)acrylate, glycerol (meth)acrylate, glycidyl (meth)acrylate, isobornyl (meth)acrylate, isodexyl (meth)acrylate, isooctyl (meth)acrylate, lauryl (meth)acrylate, 2-methoxyethyl (meth)acrylate, methoxyethyleneglycol (meth)acrylate, methoxydiethyleneglycol (meth)acrylate, phenoxyethyl (meth)acrylate, stearyl (meth)acrylate, 1-naphthyl (meth)acrylate, 2-naphthyl (meth)acrylate, 2-hydroxyethyl (meth)acrylate, 2-hydroxypropyl (meth)acrylate, aminoethyl (meth)acrylate, and combinations thereof,
multi-functional (meth)acrylates selected from the group consisting of di(meth)acrylates, tri(meth)acrylates, tetra(meth)acrylates, penta(meth)acrylates, hexa(meth)acrylates, and mixtures thereof; and
mixtures thereof.

21. The photosensitive paste composition of claim 15, wherein the organic material further comprises an additive selected from the group consisting of polymerization inhibitors, antioxidants, ultraviolet absorbents, antifoaming agents, dispersants, leveling agents, plasticizers, thixotropic agents, and combinations thereof.

22. The photosensitive paste composition of claim 15, wherein the organic material further comprises a solvent selected from the group consisting of ethyl carbitol, butyl carbitol, ethyl carbitol acetate, butyl carbitol acetate, texanol, terpine oil, diethylene glycol, dipropylene glycol, tripropylene glycol, dipropyleneglycol methylether, dipropyleneglycol ethylether, dipropyleneglycol monomethylether acetate, γ-butyrolactone, cellosolve acetate, butyl cellosolve acetate, and combinations thereof.

23. A barrier rib of a plasma display panel prepared from the photosensitive paste composition according to claim 1.

24. A plasma display panel comprising the barrier rib according to claim 23.

* * * * *